(12) United States Patent
Bi et al.

(10) Patent No.: US 10,957,599 B2
(45) Date of Patent: Mar. 23, 2021

(54) INTEGRATING EXTRA GATE VFET WITH SINGLE GATE VFET

(71) Applicant: International Business Machines Corporation, Armonk, NY (US)

(72) Inventors: Zhenxing Bi, Niskayuna, NY (US); Kangguo Cheng, Schenectady, NY (US); Junli Wang, Slingerlands, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/182,848

(22) Filed: Nov. 7, 2018

(65) Prior Publication Data

US 2020/0144124 A1    May 7, 2020

(51) Int. Cl.
*H01L 29/76* (2006.01)
*H01L 21/8234* (2006.01)
*H01L 27/088* (2006.01)

(52) U.S. Cl.
CPC ........ *H01L 21/823412* (2013.01); *H01L 21/823456* (2013.01); *H01L 21/823487* (2013.01); *H01L 27/088* (2013.01)

(58) Field of Classification Search
CPC ............ H01L 21/823486; H01L 21/823487
See application file for complete search history.

(56) References Cited

U.S. PATENT DOCUMENTS

| 4,970,173 | A | 11/1990 | Robb |
| 8,415,737 | B2 | 4/2013 | Brar et al. |
| 9,799,570 | B1* | 10/2017 | Cheng ............... H01L 21/82387 |
| 10,629,720 | B2 | 4/2020 | Jiang |
| 2007/0007601 | A1 | 1/2007 | Hsu et al. |
| 2014/0284723 | A1* | 9/2014 | Lee ....................... H01L 29/785 257/369 |
| 2017/0186866 | A1 | 6/2017 | Einav |
| 2017/0287788 | A1 | 10/2017 | Doris et al. |
| 2018/0069131 | A1 | 3/2018 | Balakrishnan et al. |
| 2018/0090488 | A1 | 3/2018 | Cheng et al. |
| 2018/0102427 | A1 | 4/2018 | Marino et al. |
| 2018/0122923 | A1 | 5/2018 | Basker et al. |

FOREIGN PATENT DOCUMENTS

| EP | 2365533 A2 | 9/2011 |
| EP | 2549540 A2 | 1/2013 |

* cited by examiner

*Primary Examiner* — Samuel A Gebremariam
(74) *Attorney, Agent, or Firm* — Cantor Colburn LLP; Randall Bluestone

(57) ABSTRACT

Embodiments of the present invention are directed to techniques for integrating an extra gate (EG) vertical field effect transistor (VFET) with a single gate (SG) VFET. In a non-limiting embodiment of the invention, a bottom source or drain (S/D) layer is formed over a substrate. A first semiconductor fin is formed over the bottom S/D layer in a first region of the substrate and a second semiconductor fin is formed over the bottom S/D layer in a second region of the substrate. A block mask is formed over the first semiconductor fin and the second semiconductor fin is recessed. The second semiconductor fin is exposed to an isotropic or anisotropic fin trim.

13 Claims, 20 Drawing Sheets

INTEGRATING EXTRA GATE VFET WITH SINGLE GATE VFET

BACKGROUND

The present invention generally relates to fabrication methods and resulting structures for semiconductor devices, and more specifically, to fabrication methods and resulting structures for integrating an extra gate (EG) vertical field effect transistor (VFET) with a single gate (SG) VFET.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. Some nonplanar transistor device architectures, such as VFETs, employ semiconductor fins and side-gates that can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for integrating an extra gate (EG) vertical field effect transistor (VFET) with a single gate (SG) VFET. A non-limiting example of the method includes forming a bottom source or drain (S/D) layer over a substrate. A first semiconductor fin is formed over the bottom S/D layer in a first region of the substrate and a second semiconductor fin is formed over the bottom S/D layer in a second region of the substrate. A block mask is formed over the first semiconductor fin and the second semiconductor fin is recessed. The second semiconductor fin is exposed to an isotropic fin trim.

Embodiments of the invention are directed to a method for integrating an EG VFET with a SG VFET. A non-limiting example of the method includes forming a bottom S/D layer over a substrate. A first semiconductor fin is formed over the bottom S/D layer in a first region of the substrate and a second semiconductor fin is formed over the bottom S/D layer in a second region of the substrate. A block mask is formed over the first semiconductor fin and the second semiconductor fin is exposed to an anisotropic fin trim.

Embodiments of the invention are directed to an EG VFET with a SG VFET. A non-limiting example of the semiconductor device includes a bottom S/D layer over a substrate. A first semiconductor fin is over the bottom S/D layer in a first region of the substrate and a second semiconductor fin is over the bottom S/D layer in a second region of the substrate. A fin height and a fin width of the first semiconductor fin is greater than a fin height and a fin width, respectively, of the second semiconductor fin. The device further includes a first gate over a channel region of the first semiconductor fin and a second gate over a channel region of the second semiconductor fin. A gate length of the first gate is greater than a gate length of the second gate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
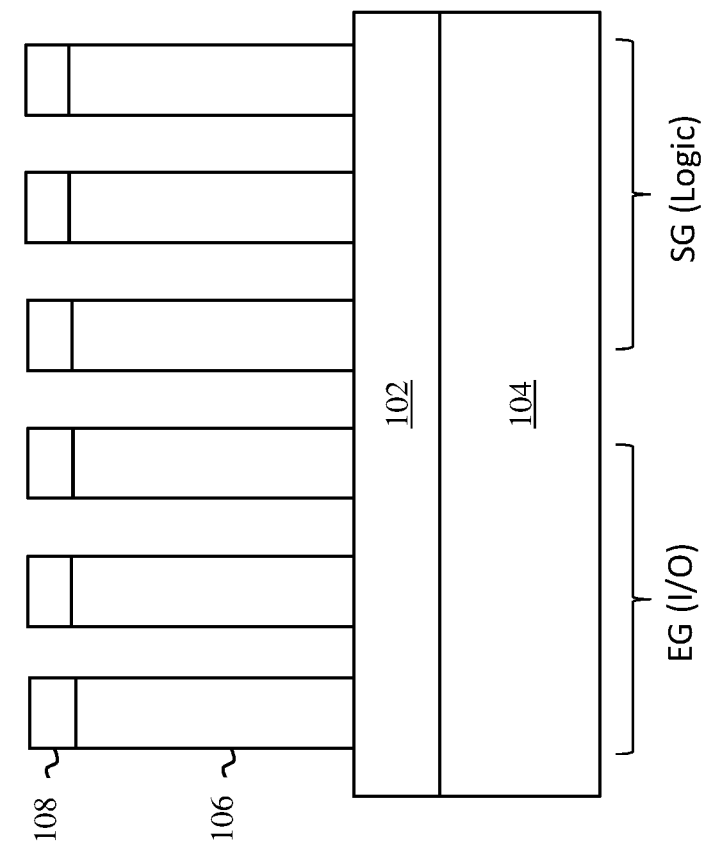
FIG. 1 depicts a cross-sectional view of a semiconductor structure after initial processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

To increase transistor densities, some device manufacturers have developed non-planar transistor architectures. In vertical field effect transistors (VFETs), for example, the source to drain current flows in a direction that is perpendicular to a major surface of the substrate. For example, in a known VFET configuration a major substrate surface is horizontal, and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

While VFET architectures have enabled smaller device footprints, there are challenges to providing VFETs with equal or superior performance characteristics to lateral devices. For example, high voltage devices for input/output (I/O) circuits require supernormal gate dielectrics as compared to single gate devices used for logic circuits. The less efficient high current carrying capability of a VFET, however, makes it very hard to combine both a single gate (SG) device and a high voltage I/O device (referred to as an "extra gate device," or "EG device") on the same chip using VFET architectures. Moreover, process complexity is multiplied when fabricating a SG VFET and an EG VFET in parallel, due to the fin height, fin width, and gate length process control requirements inherent in such an arrangement.

Turning now to an overview of aspects of the present invention, one or more embodiments of the invention address the above-described shortcomings of the prior art by providing fabrication methods and resulting structures for integrating an EG device with a SG VFET. The fabrication scheme described herein leverages an isotropic fin trim or an anisotropic fin trim to selectively reduce the fin width and fin height of some semiconductor fins on a substrate (i.e., on chip). The modified fins (i.e., SG fins) and unmodified fins (i.e., EG fins) can then be processed in parallel. In this manner, a SG VFET device can be integrated with an EG VFET device having a larger fin width, fin height, and gate length.

Advantageously, this scheme simplifies fin profile (e.g., fin height and fin width) and gate profile (e.g., gate length) process controls. Moreover, a bottom source/drain (S/D) can be formed prior to the SG fins and EG fins. Consequently, a shared bottom S/D is possible. In addition, the fabrication scheme results in multi-height SG/EG VFET devices with coplanar top S/D epitaxies, further simplifying process controls.

Turning now to a more detailed description of aspects of the present invention, FIG. 1 depicts a cross-sectional view of a partially fabricated semiconductor structure 100 after an initial set of fabrication operations have been performed in accordance with embodiments of the invention. As depicted in FIG. 1, the partially fabricated semiconductor structure 100 can include a bottom S/D 102 formed on a substrate 104. In some embodiments of the invention, the bottom S/D 102 is formed to a thickness of about 4 nm to about 20 nm, for example 10 nm, although other thicknesses are within the contemplated scope of the invention.

In some embodiments of the invention, the bottom S/D 102 can be epitaxially grown on exposed surfaces of the substrate 104. The terms "epitaxial growth and/or deposition" and "epitaxially formed and/or grown" refer to the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on other exposed surfaces, such as silicon dioxide or silicon nitride surfaces.

Epitaxial semiconductor materials can be grown using, for example, vapor-phase epitaxy (VPE), molecular beam epitaxy (MBE), liquid-phase epitaxy (LPE), or other suitable processes. The bottom S/D 102 can include epitaxial semiconductor materials grown from gaseous or liquid precursors.

In some embodiments of the invention, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., P or As) or p-type dopants (e.g., Ga, B, $BF_2$, or Al). In some embodiments of the invention, the bottom S/D 102 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

The substrate 104 can be made of any suitable substrate material, such as, for example, Si, SiGe, SiC, Group III-V compound semiconductor, Group II-VI compound semiconductor, or semiconductor-on-insulator (SOI). In some embodiments of the invention, the substrate 104 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, one or more semiconductor fins 106 are formed on the bottom S/D 102. The semiconductor fins 106 can be formed on the bottom S/D 102 using known front-end-of-line (FEOL) VFET fabrication techniques, such as, for example, self-aligned quadruple patterning (SAQP) patterning. In some embodiments of the invention, a semiconductor layer (not depicted) can be formed over the bottom S/D 102 and patterned to define the semiconductor fins 106. The semiconductor layer can be epitaxially grown over the bottom S/D 102. The semiconductor layer can be formed of the same, or a different, semiconductor material as the substrate 104.

In some embodiments of the invention, a hard mask 108 is formed over the semiconductor layer, the hard mask 108 is patterned to expose portions of the semiconductor layer, and the exposed portions of the semiconductor layer are recessed to define the semiconductor fins 106. The exposed portions of the semiconductor layer can be removed using an etch process, which can be a wet etch process, a dry etch process or a combination of sequential wet and/or dry etches. In some embodiments of the invention, the hard mask 108 includes a nitride, such as silicon nitride. In some embodiments of the invention, the hard mask 108 is formed to a thickness of 40 nm, although other thicknesses are within the contemplated scope of the invention.

The semiconductor fins 106 can each have a height ranging from 4 nm to 150 nm. In some embodiments of the present invention, the semiconductor fins 106 are formed to a height of about 60 nm. Each of the fins can have a width ranging from 5 nm to 40 nm. The fins can be separated by a pitch ranging from 10 nm to 100 nm. The semiconductor fins 106 can be doped with n-type dopants (e.g., As, P, Sb) or p-type dopants (e.g., B, $BF_2$, Al, Ga) to form nFET semiconductor fins and pFET semiconductor fins, as desired. The dopant concentration can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$. In some embodiments of the invention, the semiconductor fins 106 are epitaxially grown on the bottom S/D 102.

The semiconductor fins 106 can be made of any suitable material, such as, for example, Si, SiGe, Group II-IV compound semiconductor, Group III-V compound semiconductor, or other suitable materials. Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. In some embodiments of the invention, the semiconductor fins 106 are silicon or silicon germanium fins. In some embodiments of the invention, the semiconductor fins 106 are silicon germanium fins having a germanium concentration of about 10 to about 80 percent.

Figure 2:
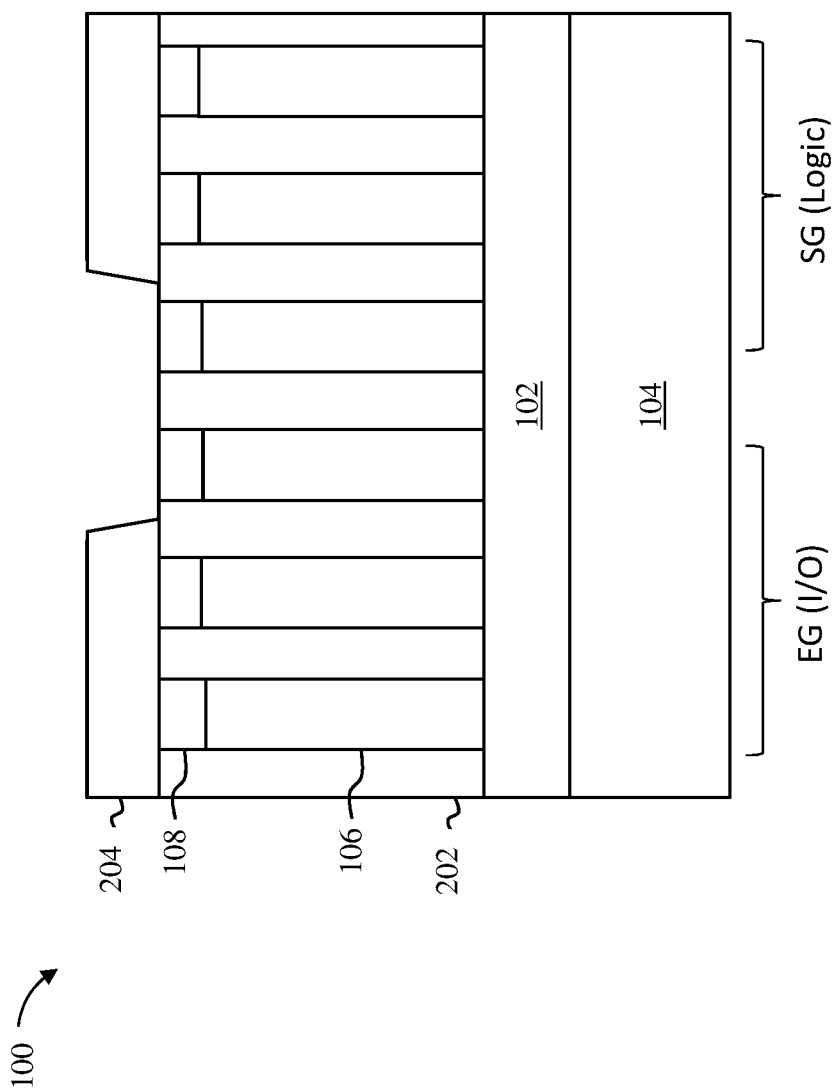
FIG. 2 depicts a cross-sectional view of the semiconductor structure after one or more processing operations according to one or more embodiments of the invention.

FIG. 2 depicts a cross-sectional view of the semiconductor structure 100 during an intermediate operation of a method of fabricating a semiconductor device according to one or more embodiments of the invention. As illustrated in FIG. 2, an interlayer dielectric 202 can be formed over the bottom S/D 102 to fill any spaces between the semiconductor fins 106.

The interlayer dielectric 202 can be made of any suitable dielectric material, such as, for example, porous silicates, carbon doped oxides, silicon dioxides, silicon nitrides, silicon oxynitrides, or other dielectric materials. Any known manner of forming the interlayer dielectric 202 can be utilized, such as, for example, CVD, PECVD, ALD, flowable CVD, spin-on dielectrics, or PVD. In some embodiments of the invention, the interlayer dielectric 202 is planarized to a top surface of the hard mask 108, using, for example, a chemical-mechanical planarization (CMP) process.

In some embodiments of the invention, a hard mask 204 is formed over the interlayer dielectric 202 and the hard mask 108. The hard mask 204 is patterned to expose a portion of the interlayer dielectric 202. In some embodiments of the invention, the opening in the hard mask 204 defines a shallow trench isolation (STI) processing window. In some embodiments of the invention, the hard mask 108 includes a nitride, such as silicon nitride. In some embodiments of the invention, the hard mask 108 is formed to a thickness of 40 nm, although other thicknesses are within the contemplated scope of the invention.

Figure 3:
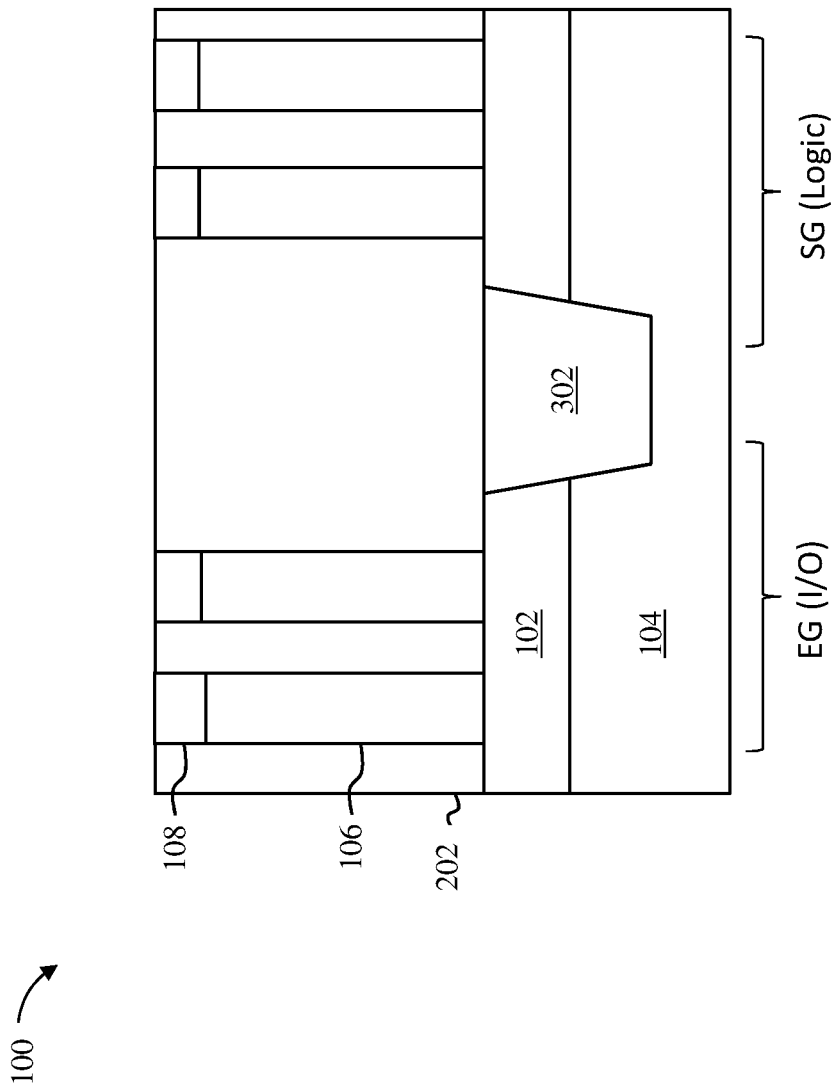
FIG. 3 depicts a cross-sectional view of the semiconductor structure after one or more processing operations according to one or more embodiments of the invention.

FIG. 3 depicts a cross-sectional view of the semiconductor structure 100 during an intermediate operation of a method of fabricating a semiconductor device according to one or more embodiments of the invention. As illustrated in FIG. 3, the exposed portions of the hard mask 108 and the semiconductor fins 106 in the STI processing window exposed by the patterning of the hard mask 204 are removed. The exposed semiconductor fins 106 can be removed using an etch process, such as, for example, a wet etch process, a dry etch process or a combination of sequential wet and/or dry etches. In some embodiments of the invention, the exposed semiconductor fins 106 are removed using a RIE. In some embodiments of the invention, the RIE is selective to the hard mask 204.

In some embodiments of the invention, exposed portions of the bottom S/D 102 and the substrate 104 in the STI processing window are also removed using, for example, a wet etch process, a dry etch process or a combination of sequential wet and/or dry etches. The removed portions of the bottom S/D 102 and the substrate 104 can be replaced with dielectric material. In this manner, an STI region 302 can be formed in the substrate 104. The STI region 302 electrically isolates semiconductor fins 106 in a first region (i.e., in an EG or I/O region) from semiconductor fins 106 in a second region (i.e., in an SG or logic region). In some embodiments of the invention, dielectric material is overfilled into the STI region 302 and between the remaining semiconductor fins 106. In some embodiments of the invention, the dielectric material is planarized to a surface of the hard mask 108.

Figure 4:
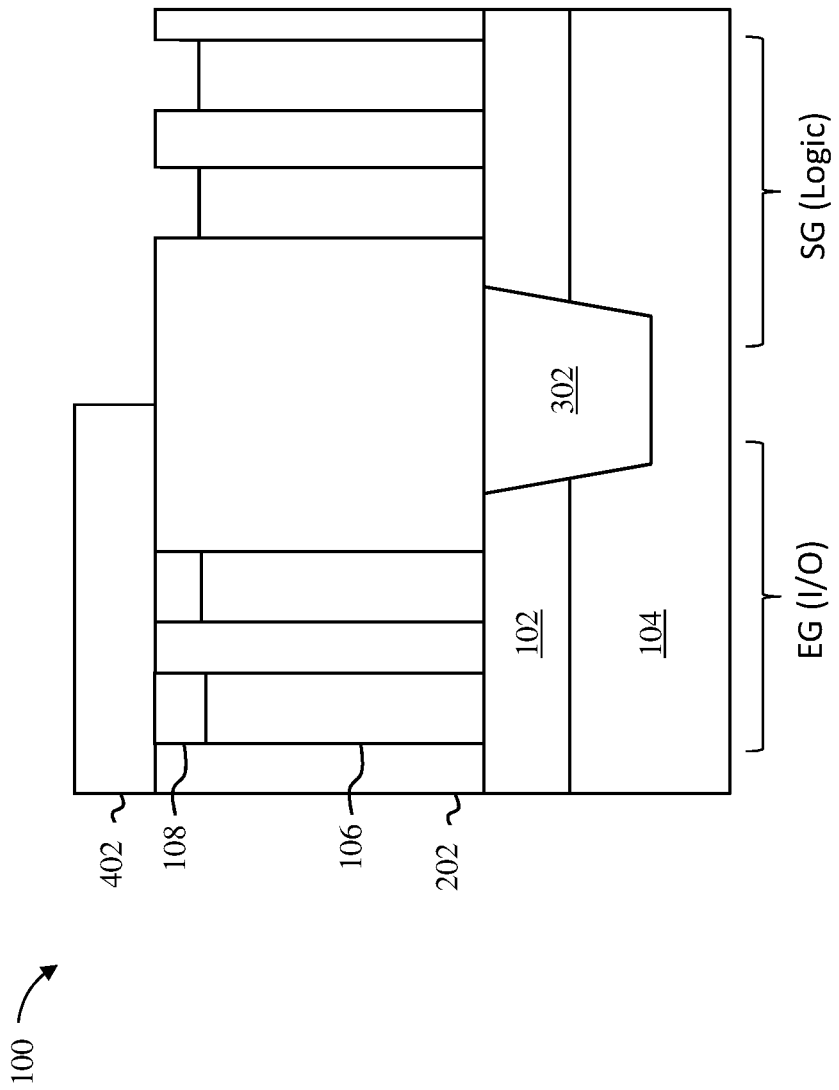
FIG. 4 depicts a cross-sectional view of the semiconductor structure after one or more processing operations according to one or more embodiments of the invention.

FIG. 4 depicts a cross-sectional view of the semiconductor structure 100 during an intermediate operation of a method of fabricating a semiconductor device according to one or more embodiments of the invention. As illustrated in FIG. 4, a block mask 402 can be formed over the semiconductor fins 106 in the EG region. The exposed portions of the hard mask 108 in the SG region can then be removed. In some embodiments of the invention, portions of the hard mask 108 in the SG region can be removed to expose a surface of one or more of the semiconductor fins 106 in the SG region. The hard mask 108 can be removed using, for example, a wet etch process, a dry etch process or a combination of sequential wet and/or dry etches.

Figure 5:
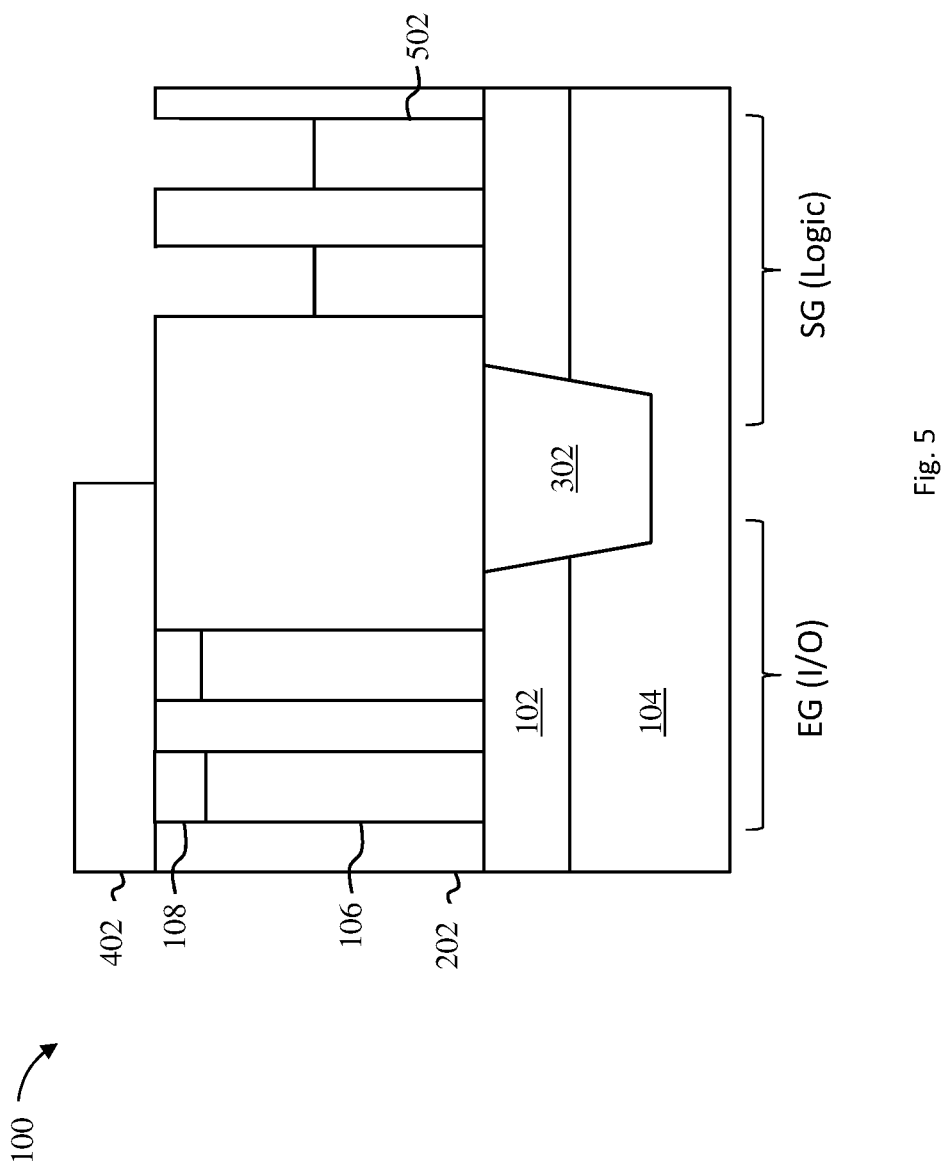
FIG. 5 depicts a cross-sectional view of the semiconductor structure after one or more processing operations according to one or more embodiments of the invention.

FIG. 5 depicts a cross-sectional view of the semiconductor structure 100 during an intermediate operation of a method of fabricating a semiconductor device according to one or more embodiments of the invention. As illustrated in FIG. 5, the exposed semiconductor fins 106 (i.e., those fins in the SG region) are recessed to define one or more recessed fins 502. The semiconductor fins 106 in the EG region (i.e., those fins protected by the block mask 402) define one or more EG fins. The recessed fins 502 can be recessed using, for example, a wet etch process, a dry etch process or a combination of sequential wet and/or dry etches. In some embodiments of the invention, the recessed fins 502 are recessed using a timed RIE (e.g., a timed selective silicon RIE). In this manner, the recessed fins 502 can be recessed to any desirable height, such as a height of 10, 20, 30, 40, 50, 60, 70, 80, or 90 percent the height of the semiconductor fins 106, although other heights are within the contemplated scope of the invention. In some embodiments of the invention, the surface of the recessed fins 502 is cleaned of impurities, such as silicon oxide.

Figure 6:
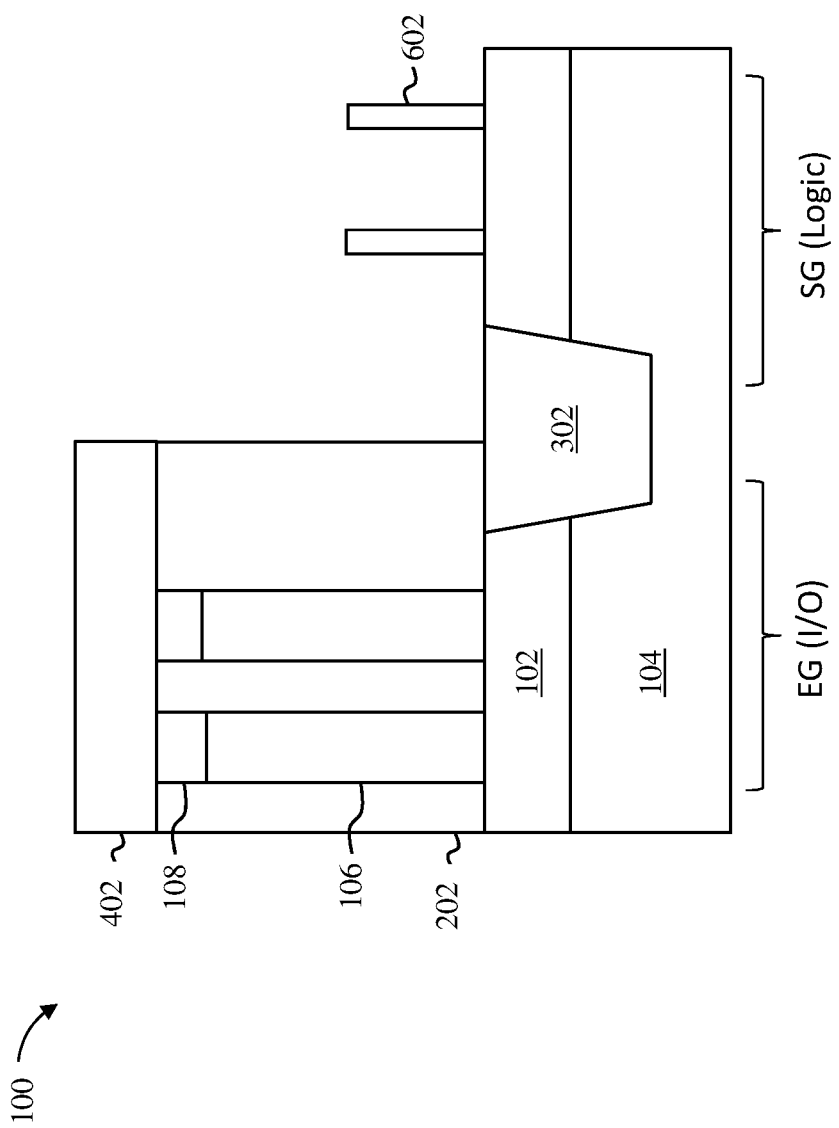
FIG. 6 depicts a cross-sectional view of the semiconductor structure after one or more processing operations according to one or more embodiments of the invention.

FIG. 6 depicts a cross-sectional view of the semiconductor structure 100 during an intermediate operation of a method of fabricating a semiconductor device according to one or more embodiments of the invention. As illustrated in FIG. 6, the interlayer dielectric 202 in the SG region is recessed to a surface of the bottom S/D 102. The interlayer dielectric 202 can be recessed using, for example, a wet etch process, a dry etch process or a combination of sequential wet and/or dry etches. In some embodiments of the invention, the interlayer dielectric 202 is recessed using a directional RIE. In this manner, sidewalls of the recessed fins 502 are exposed.

In some embodiments of the invention, the recessed fins 502 are trimmed to define one or more SG fins 602. The recessed fins 502 can be trimmed using an isotropic fin trim. In some embodiments of the invention, the isotropic fin trim is an in-situ reactive surface etch. In some embodiments of the invention, the fin trim process decreases the fin width and the fin height of the SG fins 602 by a same distance (within a tolerance of, for example, 0.2 to 1 nm). The SG fins 602 can be trimmed, relative to the recessed fins 502, by a distance of 0.5 to about 10 nm. For example, the SG fins 602 can be trimmed (i.e., the fin width and fin height can be reduced) by about 5 nm, although other trim severities are within the contemplated scope of the invention.

Figure 7:
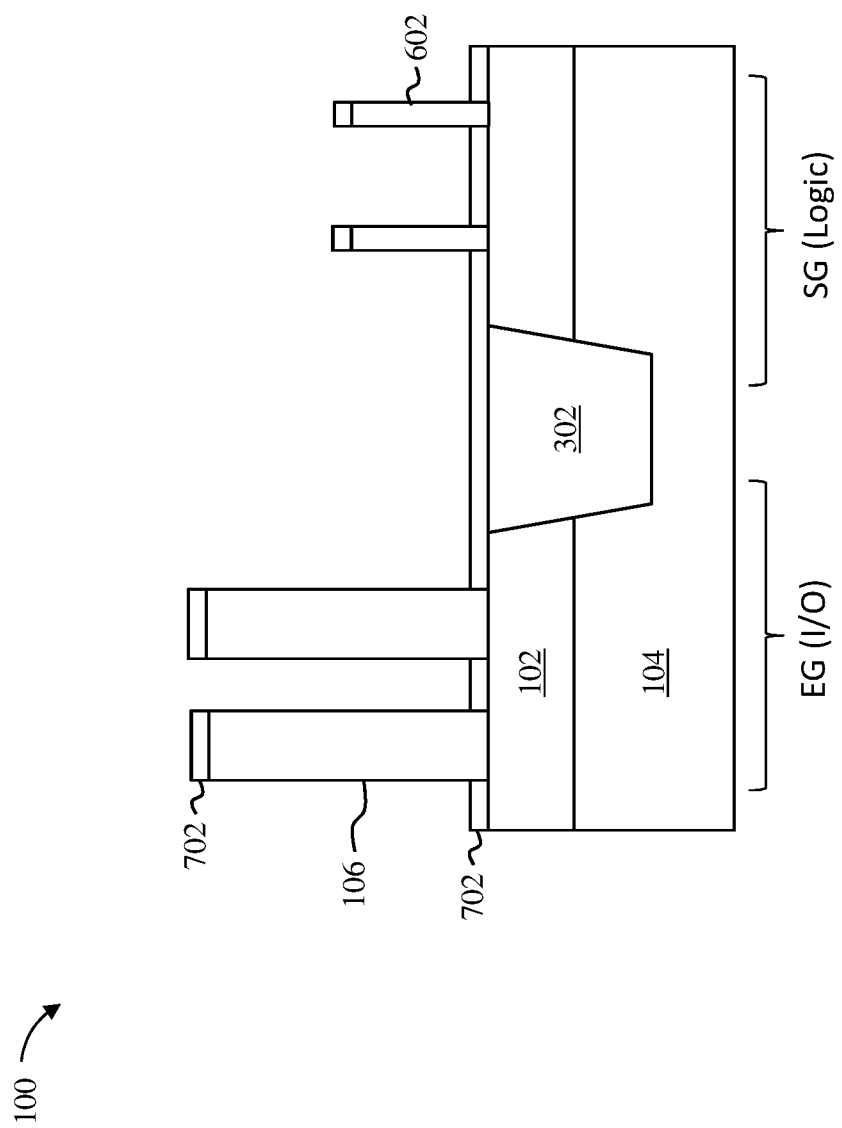
FIG. 7 depicts a cross-sectional view of the semiconductor structure after one or more processing operations according to one or more embodiments of the invention.

FIG. 7 depicts a cross-sectional view of the semiconductor structure 100 during an intermediate operation of a method of fabricating a semiconductor device according to one or more embodiments of the invention. As illustrated in FIG. 7, the block mask 402 can be removed and the interlayer dielectric 202 can be recessed to a surface of the bottom S/D 102. The block mask 402 can be removed and the interlayer dielectric 202 can be recessed using, for example, a wet etch process, a dry etch process or a combination of sequential wet and/or dry etches.

In some embodiments of the invention, a bottom spacer 702 is formed on a surface of the bottom S/D 102, on a top surface of the semiconductor fins 106, and on a top surface of the SG fins 602. The bottom spacer 702 can be made of any suitable material, such as, for example, a low-k dielectric, a nitride, silicon nitride, silicon oxide, SiON, SiC, SiOCN, or SiBCN. The bottom spacer 702 can be formed to a thickness of about 2 to 10 nm, although other thicknesses are within the contemplated scope of the invention.

The bottom spacer 702 can be formed using a CVD, PECVD, ALD, PVD, chemical solution deposition, or other like processes. For example, spacer material can be deposited over the semiconductor structure 100. In some embodiments of the invention, the bottom spacer 702 is formed using a directional deposition process, during which spacer material is only deposited on horizontal surfaces of the semiconductor structure 100. In this manner, spacer material does not deposit on sidewalls of the semiconductor fins 106 or on sidewalls of the SG fins 602. In some embodiments of the invention, the bottom spacer 702 is formed using an anisotropic deposition, during which spacer material deposits to a greater thickness on the horizontal surfaces (with respect to the vertical surfaces). The anisotropic deposition is followed by a conformal etch back. In this manner, spacer material can be removed from the sidewalls of the semiconductor fins 106 and the SG fins 602 while still leaving spacer material on the top surfaces.

Figure 8:
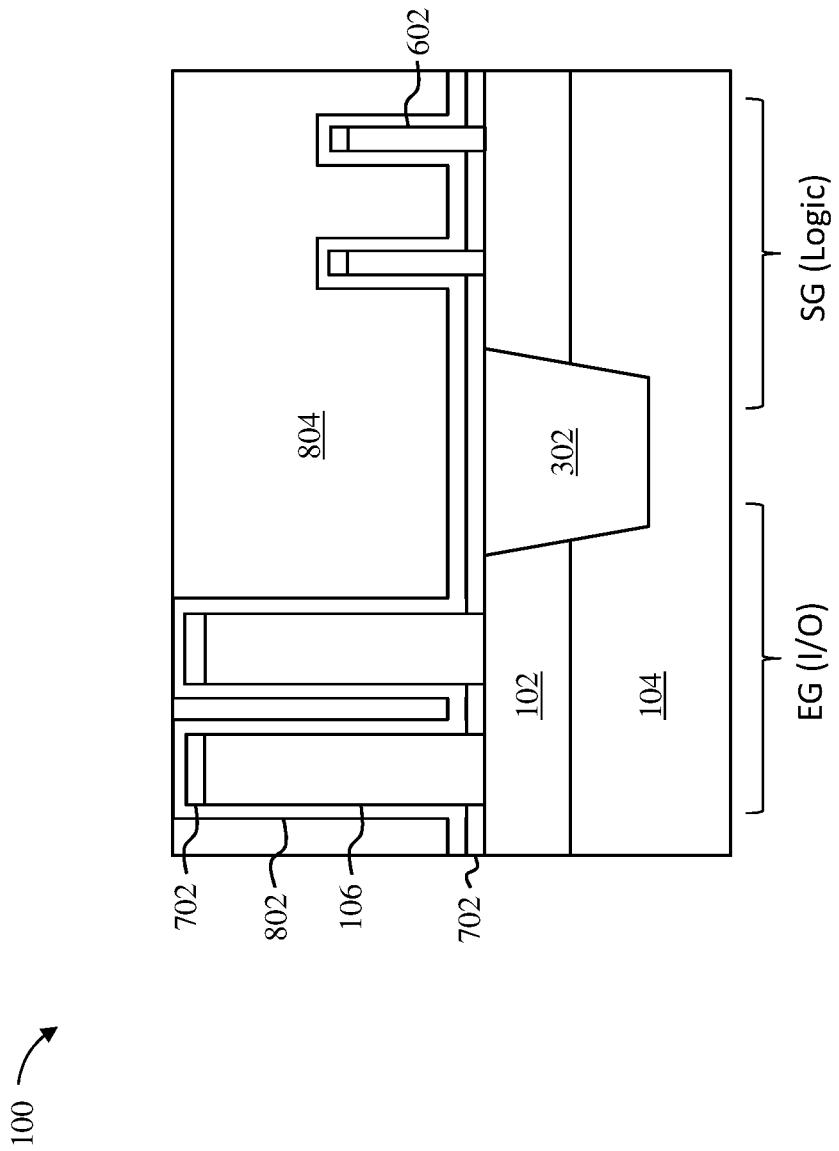
FIG. 8 depicts a cross-sectional view of the semiconductor structure after one or more processing operations according to one or more embodiments of the invention.

FIG. 8 depicts a cross-sectional view of the semiconductor structure 100 during an intermediate operation of a method of fabricating a semiconductor device according to one or more embodiments of the invention. As illustrated in FIG. 8, a gate 802 is formed over the bottom spacer 702, the semiconductor fins 106, and the SG fins 602.

The gate 802 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments of the invention, the gate 802 is a high-k metal gate (HKMG) and a high-k dielectric film (not depicted) is formed between the gate 802 and the semiconductor fins 106 and SG fins 602. In some embodiments of the invention, the high-k dielectric film can be used to modify the work function of the gate 802. The high-k dielectric film can include a dielectric material having a dielectric constant greater than or equal to, for example, 3.9, 7.0, or 10.0. Non-limiting examples of suitable materials for the high-k dielectric film include oxides (e.g., silicon oxide), nitrides (e.g., silicon nitride), oxynitrides (e.g., SiON), silicates (e.g., metal silicates), aluminates, titanates, SiBCN, SiOCN, high-k materials, or any combination thereof.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

The high-k dielectric film can be formed by any suitable deposition processes, for example, CVD, PECVD, ALD, evaporation, PVD, chemical solution deposition, or other like processes. In some embodiments of the invention, the high-k dielectric film is formed by a conformal deposition (e.g., CVD or ALD) over a surface of the semiconductor fins 106 and the SG fins 602. The thickness of the high-k dielectric film can vary depending on the deposition process as well as the composition and number of high-k dielectric materials used. In some embodiments of the invention, the high-k dielectric film can have a thickness of about 0.5 nm to about 4 nm, although other thicknesses are within the contemplated scope of the invention.

In some embodiments of the invention, work function layers (not depicted) are formed between the high-k dielectric film and the gate 802. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the gate 802. The work function layers can be formed to a thickness of about 0.5 to 10 nm, for example, 2 nm, although other thicknesses are within the contemplated scope of the invention.

In some embodiments of the invention, an interlayer dielectric 804 is formed over the semiconductor structure 100. The interlayer dielectric 804 can be made of any suitable dielectric material, such as, for example, porous silicates, carbon doped oxides, silicon dioxides, silicon nitrides, silicon oxynitrides, or other dielectric materials. Any known manner of forming the interlayer dielectric 804 can be utilized, such as, for example, CVD, PECVD, ALD, flowable CVD, spin-on dielectrics, or PVD. In some embodiments of the invention, the interlayer dielectric 804 is planarized to a top surface of the gate 802, using, for example, a chemical-mechanical planarization (CMP) process.

Figure 9:
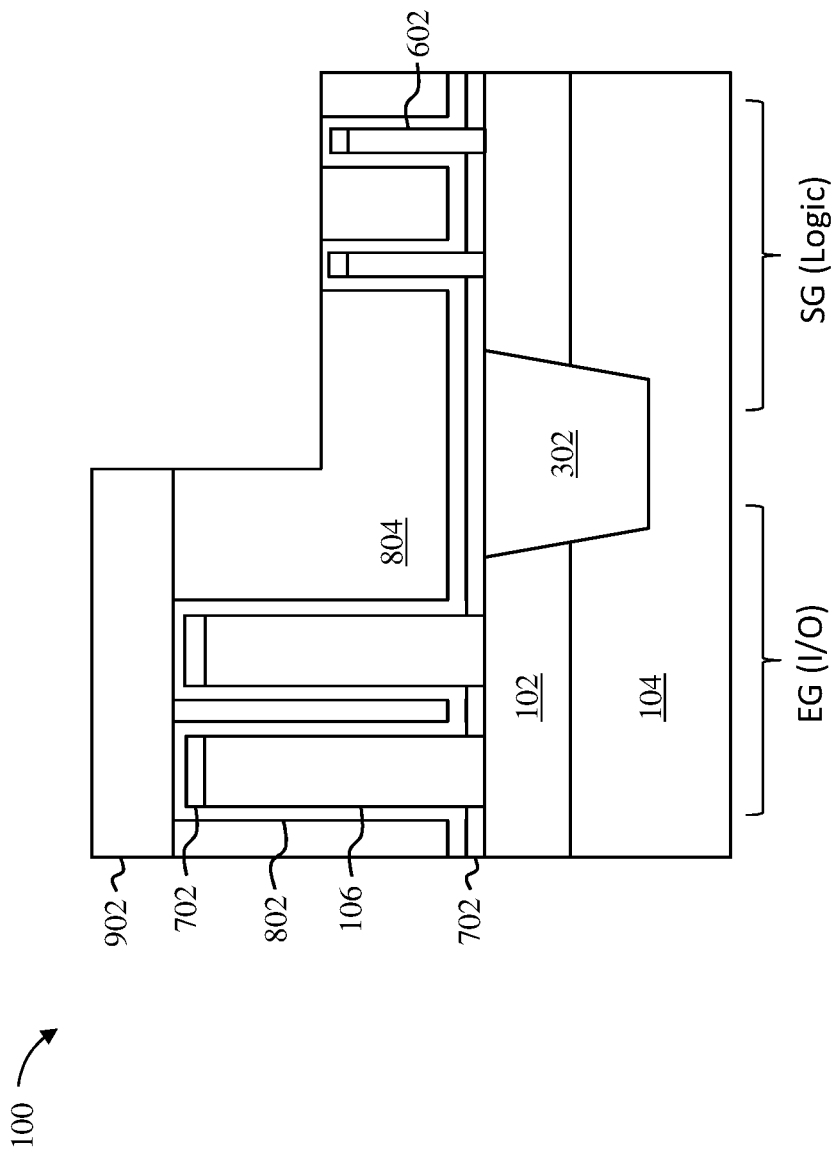
FIG. 9 depicts a cross-sectional view of the semiconductor structure after one or more processing operations according to one or more embodiments of the invention.

FIG. 9 depicts a cross-sectional view of the semiconductor structure 100 during an intermediate operation of a method of fabricating a semiconductor device according to one or more embodiments of the invention. As illustrated in FIG. 9, a block mask 902 can be formed over the semiconductor fins 106 in the EG region. The block mask 902 can be patterned to expose the SG region using known processes. In some embodiments of the invention, the interlayer dielectric 804 in the exposed SG region is recessed to a surface of the SG fins 602 (or more accurately, to a top surface of the gate 802 formed over the SG fins 602). The interlayer dielectric 804 can be recessed using, for example, a wet etch process, a dry etch process or a combination of sequential wet and/or dry etches. In some embodiments of the invention, the interlayer dielectric 804 is recessed using a directional RIE.

Figure 10:
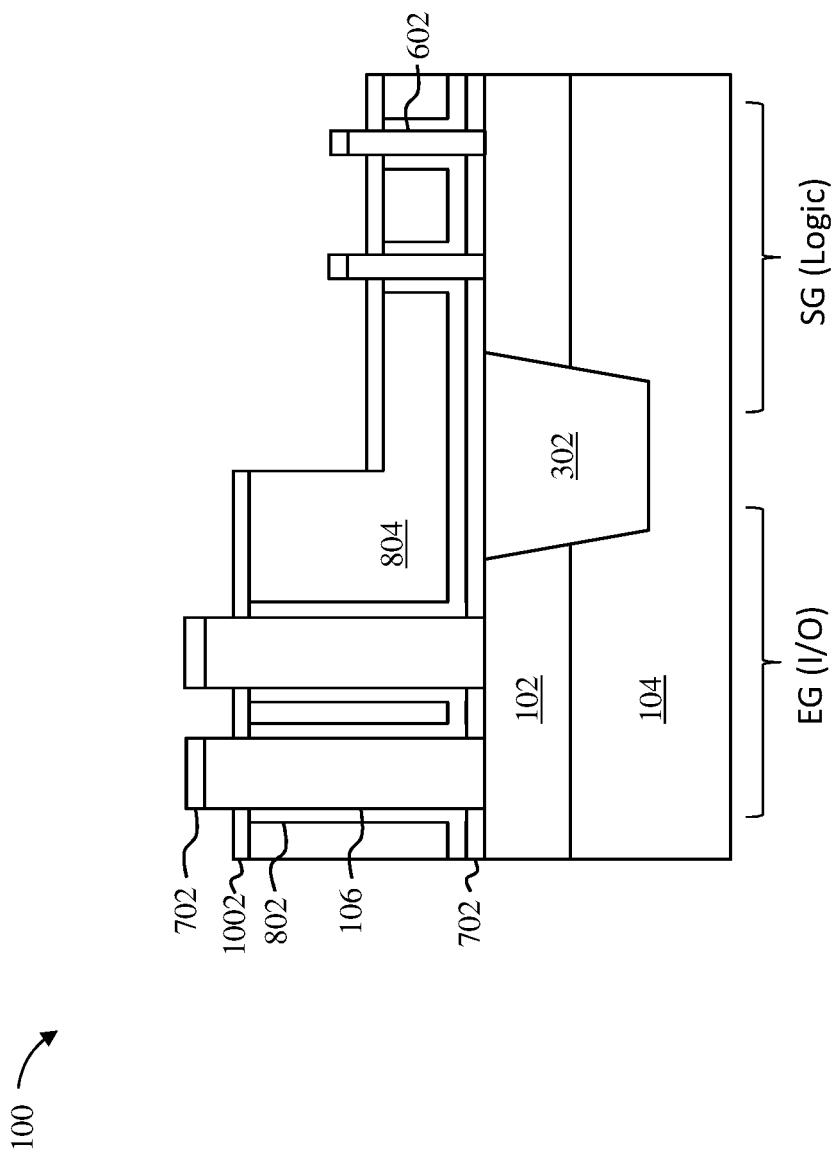
FIG. 10 depicts a cross-sectional view of the semiconductor structure after one or more processing operations according to one or more embodiments of the invention.

FIG. 10 depicts a cross-sectional view of the semiconductor structure 100 during an intermediate operation of a method of fabricating a semiconductor device according to one or more embodiments of the invention. As illustrated in FIG. 10, the block mask 902 is removed and the interlayer dielectric 804 is recessed. In some embodiments of the invention, the interlayer dielectric 804 can be recessed to expose sidewalls of the gate 802. The interlayer dielectric 804 can be recessed using, for example, a wet etch process, a dry etch process or a combination of sequential wet and/or dry etches. In some embodiments of the invention, the interlayer dielectric 804 is recessed using a directional RIE. In some embodiments of the invention, the interlayer dielectric 804 is recessed by a substantially same amount in the EG region and SG region.

In some embodiments of the invention, the gate 802 (including the high-k dielectric film and any work function layers) is recessed to a surface of the interlayer dielectric 804. In this manner, the topmost surfaces of the gate 802 can be coplanar to the topmost surface of the interlayer dielectric 804. In some embodiments of the invention, the gate 802 can be recessed using an etch process, which can be a wet etch process, a dry etch process or a combination of sequential wet and/or dry etches. In some embodiments of the invention, the bulk metal of the gate 802 is recessed prior to recessing the high-k dielectric film.

In some embodiments of the invention, a top spacer 1002 is formed on a surface of the interlayer dielectric 804 and a surface of the gate 802. The top spacer 1002 can be made of any suitable material, such as, for example, a low-k dielectric, a nitride, silicon nitride, silicon oxide, SiON, SiC, SiOCN, or SiBCN. The top spacer 1002 can be formed to a thickness of about 2 to 10 nm, although other thicknesses are within the contemplated scope of the invention.

The top spacer 1002 can be formed using a CVD, PECVD, ALD, PVD, chemical solution deposition, or other like processes. For example, spacer material can be deposited over the semiconductor structure 100. In some embodiments of the invention, the top spacer 1002 is formed using a directional deposition process, during which spacer material is only deposited on horizontal surfaces of the semiconductor structure 100. In this manner, spacer material does not deposit on sidewalls of the semiconductor fins 106 or on sidewalls of the SG fins 602. In some embodiments of the invention, the top spacer 1002 is formed using a conformal deposition process followed by directional etch to expose sidewalls of the semiconductor fins 106 and the SG fins 602. In some embodiments of the invention, the top spacer 1002 is formed using an anisotropic deposition, during which spacer material deposits to a greater thickness on the horizontal surfaces (with respect to the vertical surfaces). The anisotropic deposition is followed by a conformal etch back. In this manner, spacer material can be removed from the sidewalls of the semiconductor fins 106 and the SG fins 602. In some embodiments of the invention, spacer material is deposited over the portions of the bottom spacer 702 which are over the top surfaces of the semiconductor fins 106 and the SG fins 602.

Figure 11:
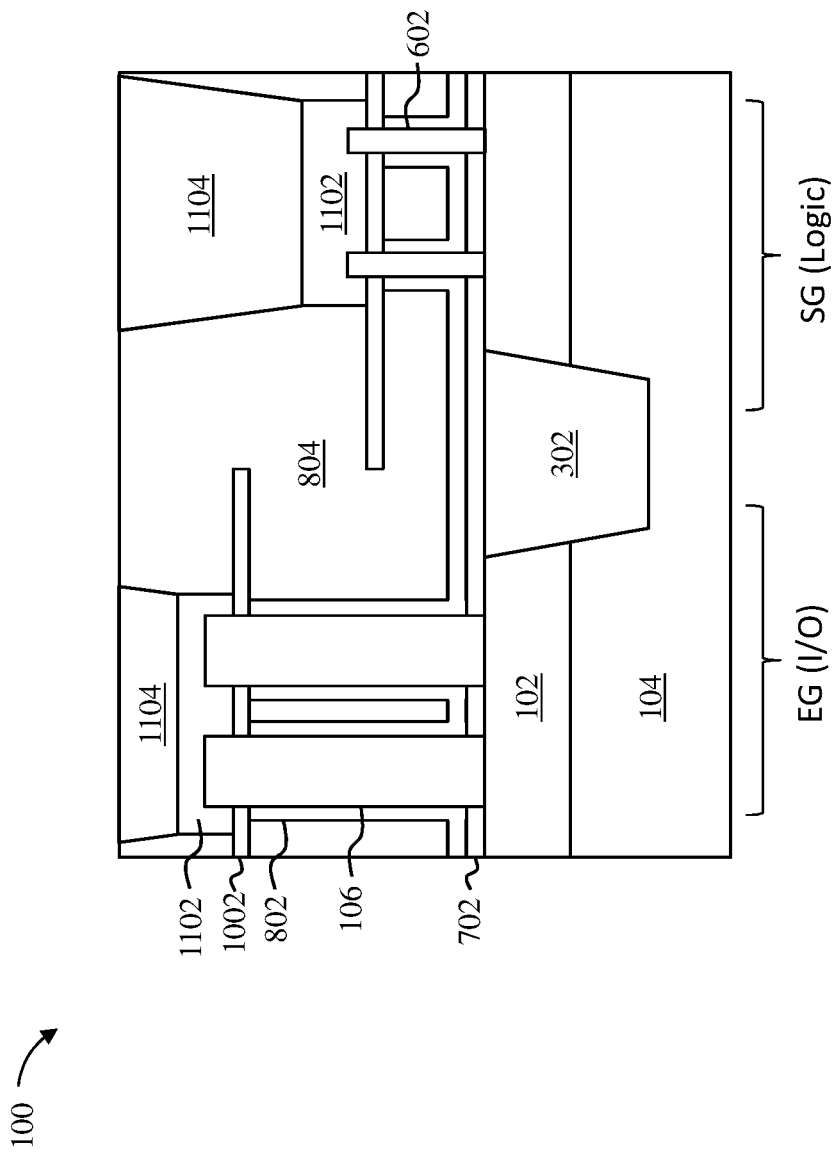
FIG. 11 depicts a cross-sectional view of the semiconductor structure after one or more processing operations according to one or more embodiments of the invention.

FIG. 11 depicts a cross-sectional view of the semiconductor structure 100 during an intermediate operation of a method of fabricating a semiconductor device according to one or more embodiments of the invention. As illustrated in FIG. 11, additional dielectric material can be deposited over the semiconductor structure 100 to refill the interlayer dielectric 804 above a topmost surface of the semiconductor fins 106. The dielectric material can be a same or different material as the interlayer dielectric 804. Any known manner of refilling the interlayer dielectric 804 can be utilized, such as, for example, CVD, PECVD, ALD, flowable CVD, spin-on dielectrics, or PVD. In some embodiments of the invention, the interlayer dielectric 804 is planarized, using, for example, a chemical-mechanical planarization (CMP) process.

In some embodiments of the invention, the interlayer dielectric 804 is patterned to expose portions of the semiconductor fins 106 and SG fins 602 above a top surface of the top spacer 1002. In some embodiments of the invention, a top S/D 1102 is formed on exposed portions of the semiconductor fins 106 and SG fins 602. In some embodiments of the invention, the top S/D 1102 is formed to a thickness of about 4 nm to about 20 nm, for example 10 nm, although other thicknesses are within the contemplated scope of the invention.

In some embodiments of the invention, the top S/D 1102 can be epitaxially grown on exposed surfaces of the semiconductor fins 106 and SG fins 602. The top S/D 1102 can include epitaxial semiconductor materials grown from gaseous or liquid precursors, in a similar manner as the bottom S/D 102.

Epitaxial silicon and silicon germanium can be doped by adding n-type dopants (e.g., P or As) or p-type dopants (e.g., Ga, B, $BF_2$, or Al). In some embodiments of the invention, the top S/D 1102 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

In some embodiments of the invention, contacts 1104 are formed over the top S/D 1102. The contacts 1104 can be formed or deposited using known metallization techniques. In some embodiments of the invention, the interlayer dielectric 804 is patterned with open trenches and a bulk contact material is deposited into the trenches. In some embodiments of the invention, the contacts 1104 are overfilled into the trenches, forming overburdens above a surface of the interlayer dielectric 804. In some embodiments of the invention, a CMP selective to the interlayer dielectric 804 removes the overburden. In this manner, the contacts 1104 are coplanar (i.e., a top surface of contacts formed in the EG region is coplanar to a top surface of contacts formed in the SG region).

The contacts 1104 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the contacts 1104 are tungsten contacts. The conductive material can further include dopants that are incorporated during or after deposition. In some embodiments of the invention, the contacts 1104 can be made of copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

Figure 12:
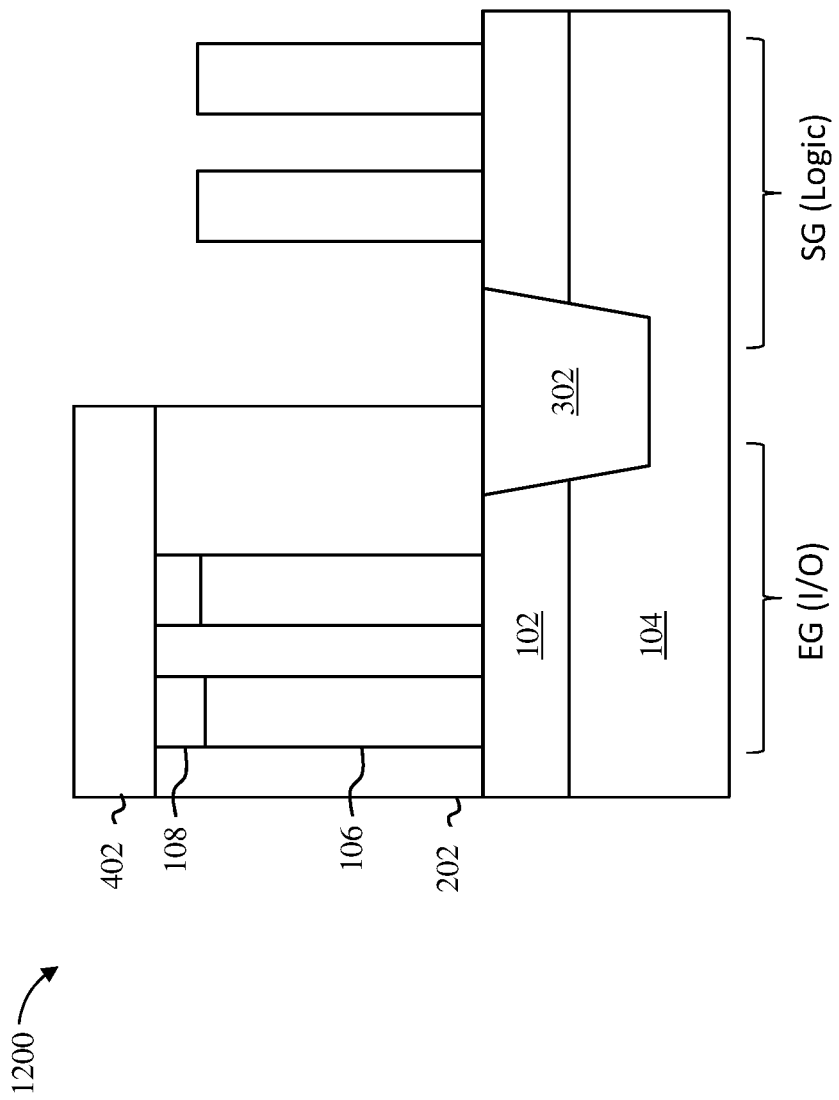
FIG. 12 depicts a cross-sectional view of the semiconductor structure after one or more processing operations according to one or more embodiments of the invention.

FIG. 12 depicts a cross-sectional view of a semiconductor structure 1200 during an intermediate operation of a method of fabricating a semiconductor device according to one or more embodiments of the invention. FIG. 12 illustrates an alternative process flow that proceeds in the same manner as for the semiconductor structure 100, except that this proves flow diverges after the block mask 402 is patterned and the exposed portions of the hard mask 108 in the SG region are removed as depicted in FIG. 4.

As illustrated in FIG. 12, the interlayer dielectric 202 in the SG region is recessed to a surface of the bottom S/D 102. The interlayer dielectric 202 can be recessed using, for example, a wet etch process, a dry etch process or a combination of sequential wet and/or dry etches. In some embodiments of the invention, the interlayer dielectric 202 is recessed using a directional RIE. In this manner, sidewalls of the semiconductor fins 106 in the SG region are exposed.

Figure 13:
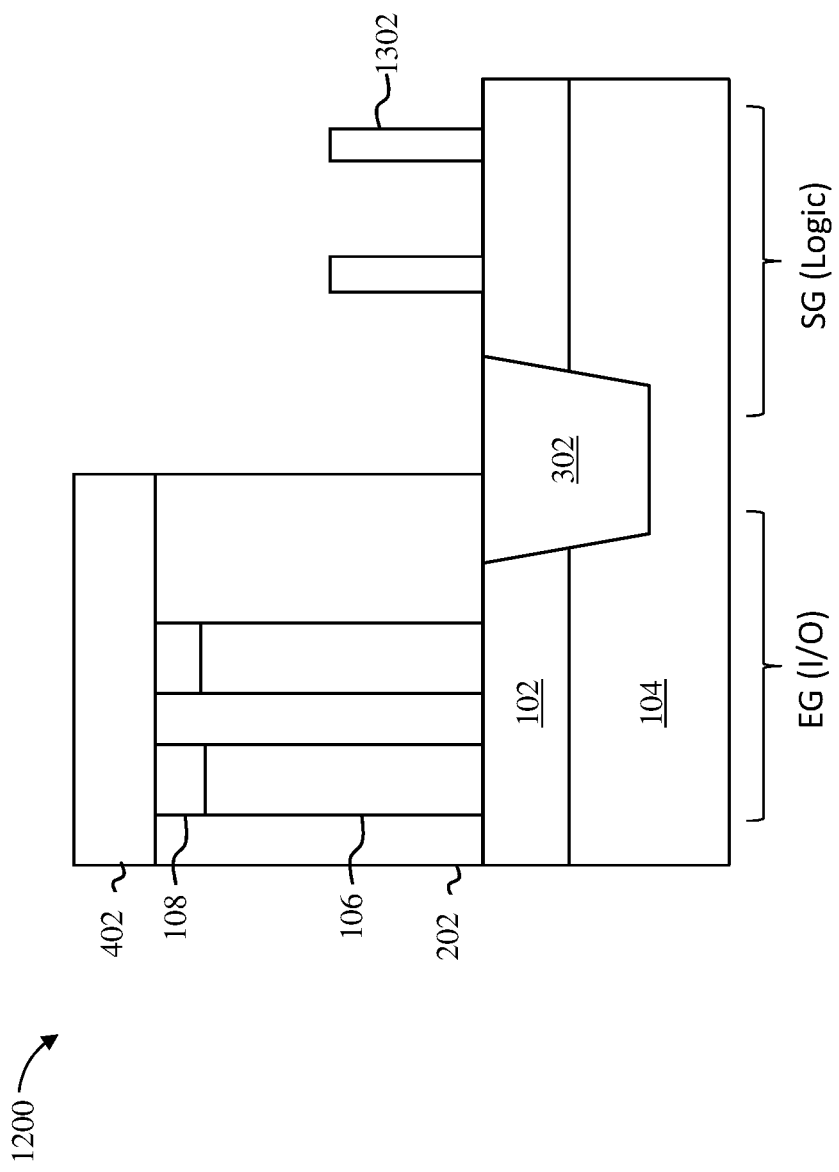
FIG. 13 depicts a cross-sectional view of the semiconductor structure after one or more processing operations according to one or more embodiments of the invention.

FIG. 13 depicts a cross-sectional view of the semiconductor structure 1200 during an intermediate operation of a method of fabricating a semiconductor device according to one or more embodiments of the invention. As illustrated in FIG. 13, the semiconductor fins 106 in the SG region can be trimmed to define one or more SG fins 1302.

The semiconductor fins 106 in the SG region can be trimmed using an anisotropic fin trim. In some embodiments of the invention, the anisotropic fin trim etches the semiconductor fins 106 vertically faster than laterally. In other words, the anisotropic fin trim can decrease the fin height by a greater amount (within a tolerance of, for example, 0.2 to 1 nm) than the fin width of the semiconductor fins 106. In some embodiments of the invention, the anisotropic fin trim has a fin height to fin width selectivity of more than 5:1 (i.e., the fin height can decrease by 5 or more times the fin width). Following the anisotropic fin trim, the process flow for the semiconductor structure 1200 can proceed in a substantially similar manner as that shown for the semiconductor structure 100.

Figure 14:
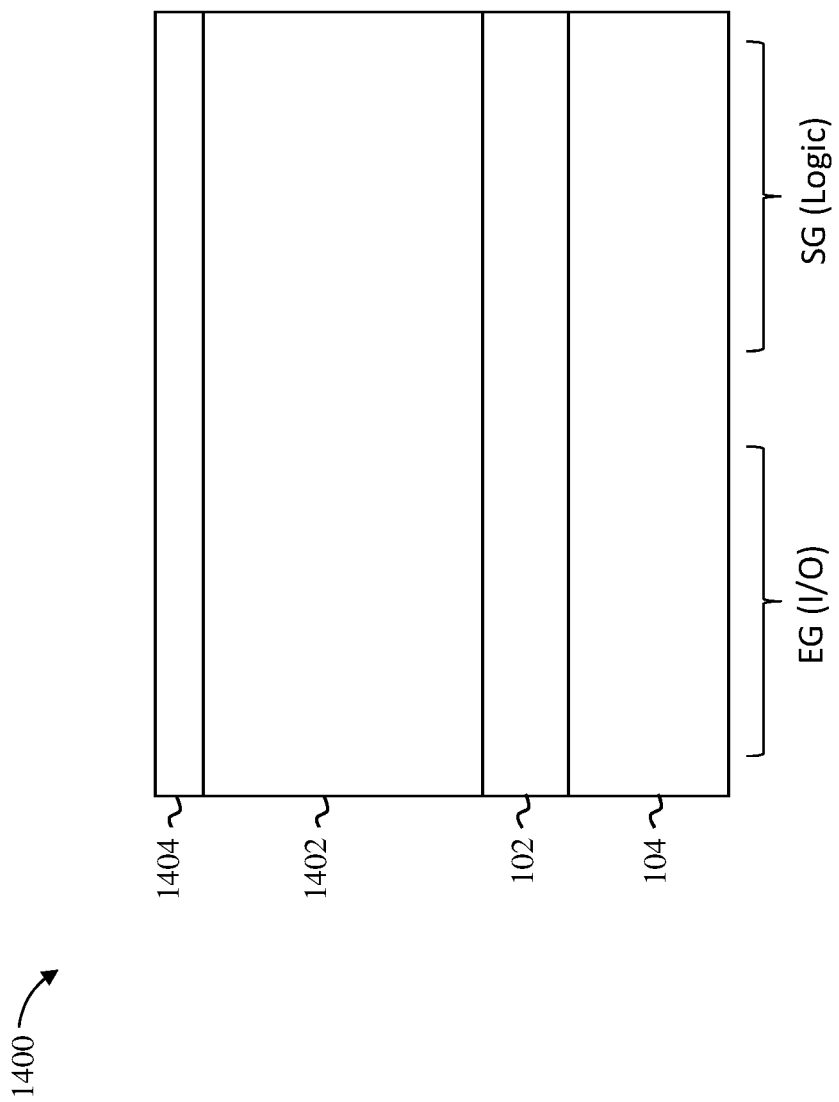
FIG. 14 depicts a cross-sectional view of the semiconductor structure after one or more processing operations according to one or more embodiments of the invention.

FIG. 14 depicts a cross-sectional view of a semiconductor structure 1400 during an intermediate operation of a method of fabricating a semiconductor device according to one or more embodiments of the invention. FIG. 14 illustrates an alternative process flow that proceeds in substantially the same manner as for the semiconductor structure 100, except that this process flow begins with a semiconductor layer height recess in the SG region (i.e., prior to the process flow depicted in FIG. 1).

As illustrated in FIG. 14, the incoming semiconductor structure 1400 can include a bottom S/D 102 formed on a substrate 104. The bottom S/D 102 and the substrate 104 can be formed in a similar manner as described previously herein. In some embodiments of the invention, a semiconductor layer 1402 is formed over the bottom S/D 102. The semiconductor layer 1402 can be epitaxially grown over the bottom S/D 102. The semiconductor layer 1402 can be formed of the same, or a different, semiconductor material as the substrate 104.

In some embodiments of the invention, a dielectric layer 1404 is formed over the semiconductor layer 1402. In some embodiments of the invention, the dielectric layer 1404 includes a nitride, such as silicon nitride, although other dielectric materials (e.g., SiON, SiC, SiOCN, and SiBCN) are within the contemplated scope of the invention. In some embodiments of the invention, the dielectric layer 1404 is formed to a thickness of 40 nm, although other thicknesses are within the contemplated scope of the invention.

Figure 15:
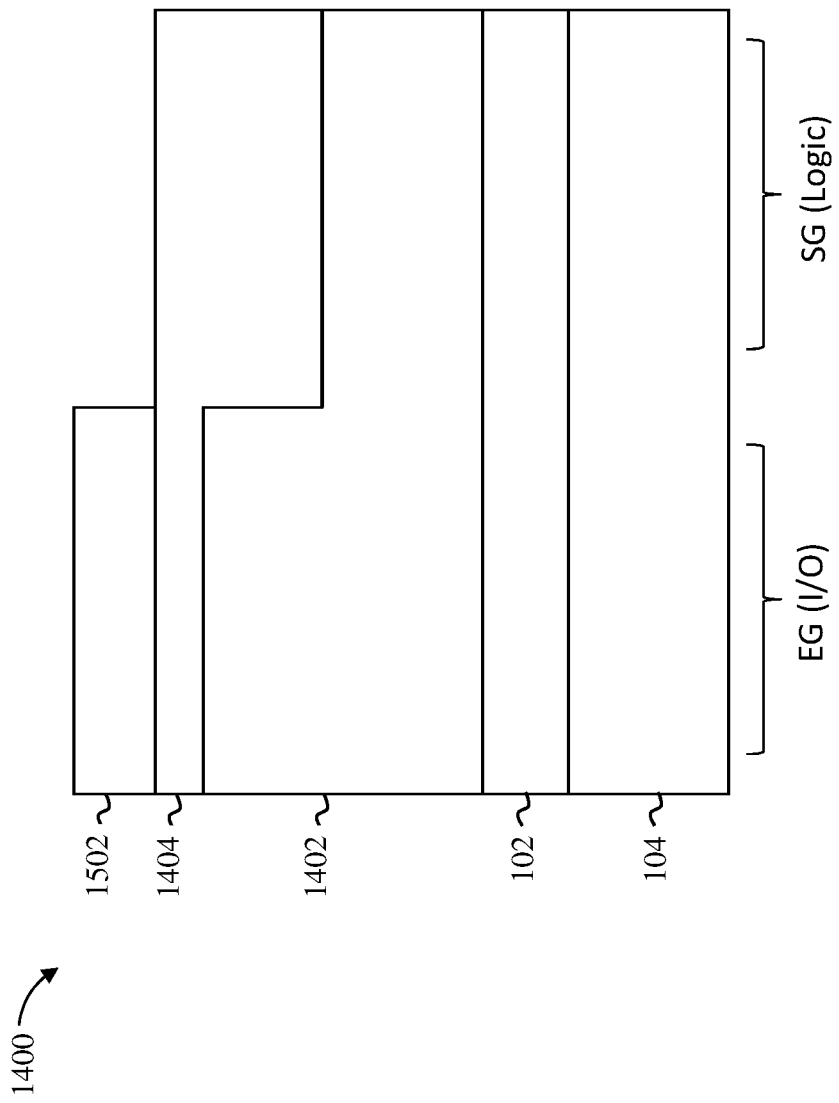
FIG. 15 depicts a cross-sectional view of the semiconductor structure after one or more processing operations according to one or more embodiments of the invention.

FIG. 15 depicts a cross-sectional view of the semiconductor structure 1400 during an intermediate operation of a method of fabricating a semiconductor device according to one or more embodiments of the invention. As illustrated in FIG. 15, a block mask 1502 can be formed over the dielectric layer 1404. The block mask 1502 can be patterned to expose the SG region.

In some embodiments of the invention, the exposed portions of the dielectric layer 1404 are removed to expose a surface of the semiconductor layer 1402. The exposed portion of the semiconductor layer 1402 is then recessed. In some embodiments of the invention, the dielectric layer 1404 and the semiconductor layer 1402 can be etched using a wet etch process, a dry etch process, or a combination of sequential wet and/or dry etches. In this manner, a thickness of the semiconductor layer 1402 in the EG region can be greater than a thickness of the semiconductor layer 1402 in the SG region.

In some embodiments of the invention, additional dielectric material can be deposited over the recessed surface of the semiconductor layer 1402. The dielectric material can be a same or different material as the dielectric layer 1404. In some embodiments of the invention, the dielectric material is deposited to a same height as the dielectric layer 1404 in the EG region. Any known manner of depositing dielectric material can be utilized, such as, for example, CVD, PECVD, ALD, flowable CVD, spin-on dielectrics, or PVD.

Figure 16:
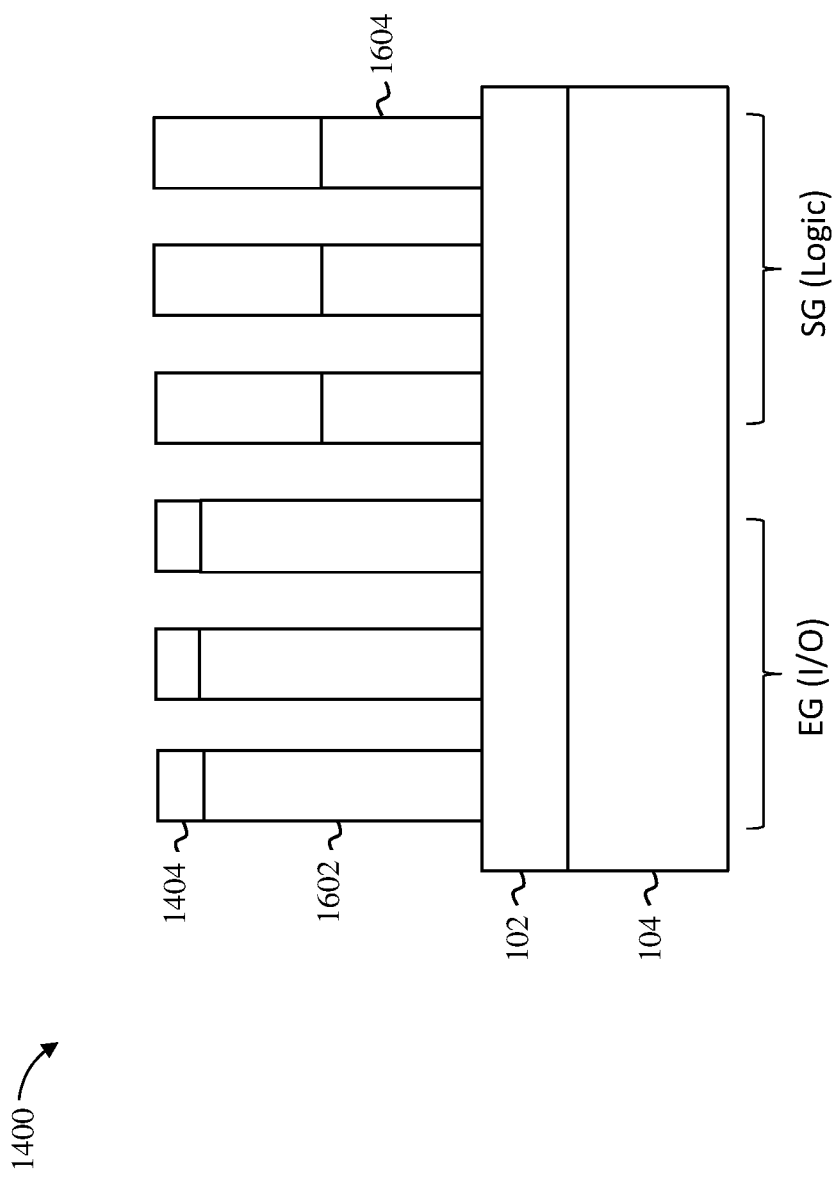
FIG. 16 depicts a cross-sectional view of the semiconductor structure after one or more processing operations according to one or more embodiments of the invention.

FIG. 16 depicts a cross-sectional view of the semiconductor structure 1400 during an intermediate operation of a method of fabricating a semiconductor device according to one or more embodiments of the invention. As illustrated in FIG. 16, the block mask 1502 can be removed and the semiconductor layer 1402 can be patterned to define one or more EG fins 1602 and one or more SG fins 1604. The semiconductor layer 1402 can be patterned using known front-end-of-line (FEOL) VFET fabrication techniques, such as, for example, self-aligned quadruple patterning (SAQP) patterning.

In some embodiments of the invention, portions of the dielectric layer 1404 and the semiconductor layer 1402 are removed to expose a surface of the bottom S/D 102. Portions of the dielectric layer 1404 and the semiconductor layer 1402 can be removed using an etch process, which can be a wet etch process, a dry etch process or a combination of sequential wet and/or dry etches. In some embodiments of the invention, the dielectric layer 1404 and the semiconductor layer 1402 are patterned using one or more RIEs.

Figure 17:
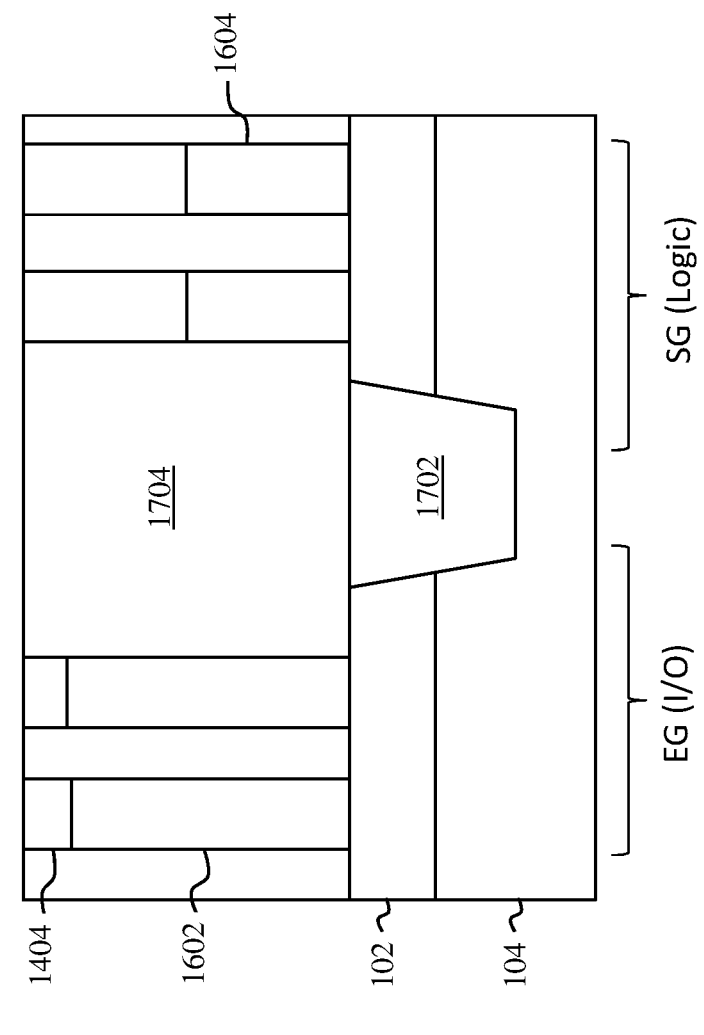
FIG. 17 depicts a cross-sectional view of the semiconductor structure after one or more processing operations according to one or more embodiments of the invention.

FIG. 17 depicts a cross-sectional view of the semiconductor structure 1400 during an intermediate operation of a method of fabricating a semiconductor device according to one or more embodiments of the invention. As illustrated in FIG. 17, some of the EG fins 1602, some of the SG fins 1604, and a portion of the bottom S/D 102 are removed. In some embodiments of the invention, the EG fins 1602, the SG fins 1604, and the portion of the bottom S/D 102 are removed using, for example, a wet etch process, a dry etch process or a combination of sequential wet and/or dry etches. The removed portions of the bottom S/D 102 and the EG fins 1602 and SG fins 1604 can be replaced with dielectric material. In this manner, an STI region 1702 can be formed in the substrate 104. The STI region 1702 electrically isolates the EG fins 1602 in the EG region from the SG fins 1604 in the SG region.

In some embodiments of the invention, an interlayer dielectric 1704 is formed over the STI region 1702 and between the remaining EG fins 1602 and SG fins 1604. In some embodiments of the invention, the interlayer dielectric 1704 is planarized to a surface of the dielectric layer 1404. The interlayer dielectric 1704 can be made of any suitable dielectric material, such as, for example, porous silicates, carbon doped oxides, silicon dioxides, silicon nitrides, silicon oxynitrides, or other dielectric materials. Any known manner of forming the interlayer dielectric 1704 can be utilized, such as, for example, CVD, PECVD, ALD, flowable CVD, spin-on dielectrics, or PVD.

Figure 18:
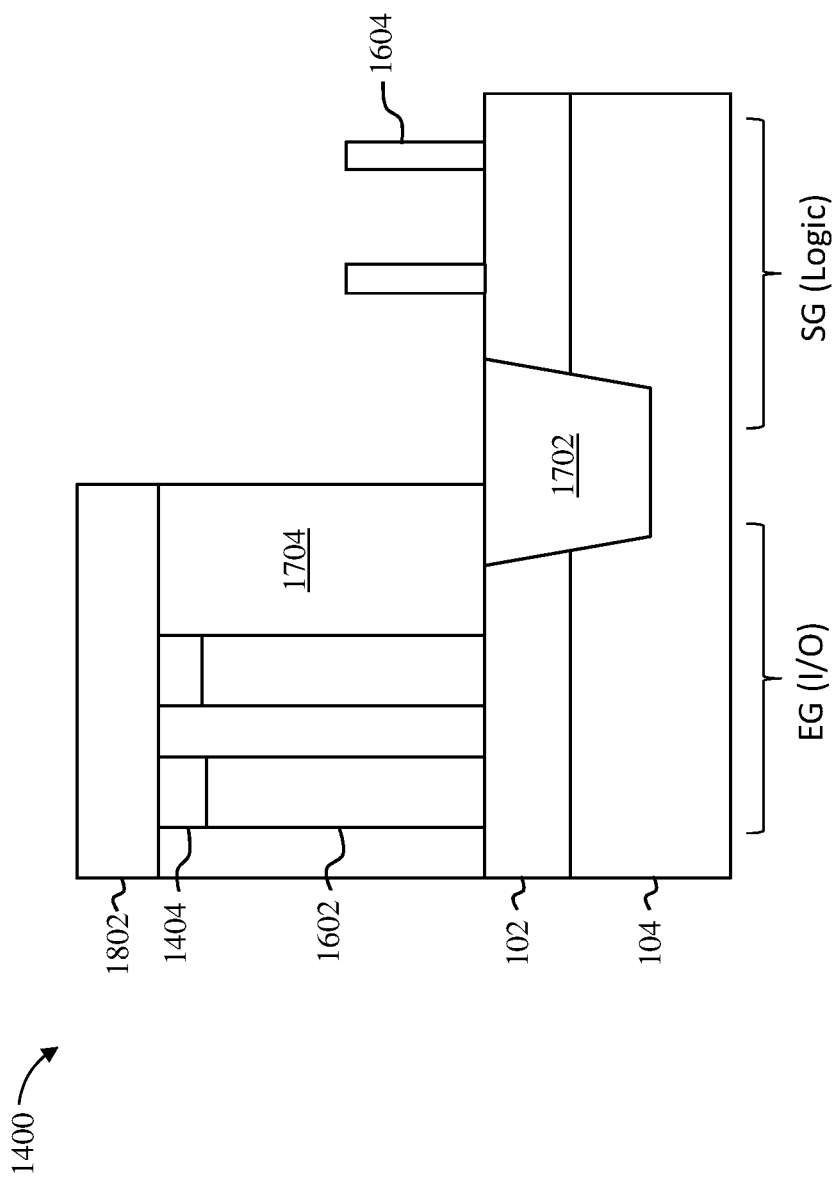
FIG. 18 depicts a cross-sectional view of the semiconductor structure after one or more processing operations according to one or more embodiments of the invention.

FIG. 18 depicts a cross-sectional view of the semiconductor structure 1400 during an intermediate operation of a method of fabricating a semiconductor device according to one or more embodiments of the invention. As illustrated in FIG. 18, a block mask 1802 can be formed over the semiconductor structure 1400. The block mask 1802 can be patterned to expose the SG region.

In some embodiments of the invention, the interlayer dielectric 1704 in the SG region is recessed to a surface of the bottom S/D 102. The interlayer dielectric 1704 can be recessed using, for example, a wet etch process, a dry etch process or a combination of sequential wet and/or dry etches. In some embodiments of the invention, the interlayer dielectric 1704 is recessed using a directional RIE. In this manner, sidewalls of the SG fins 1604 in the SG region are exposed.

In some embodiments of the invention, the exposed SG fins 1604 can be trimmed using, for example, an isotropic fin trim. In some embodiments of the invention, the isotropic fin trim is an in-situ reactive surface etch. In some embodiments of the invention, the fin trim process decreases the fin width and the fin height of the SG fins 1604 by a same distance (within a tolerance of, for example, 0.2 to 1 nm). In some embodiments of the invention, the SG fins 1604 can be trimmed by a distance of 0.5 to about 10 nm. For example, the SG fins 1604 can be trimmed (i.e., the fin width and fin height can be reduced) by about 5 nm, although other trim severities are within the contemplated scope of the invention. Following the isotropic fin trim, the process flow for the semiconductor structure 1400 can proceed in a substantially similar manner as that shown for the semiconductor structure 100 (see, e.g., FIG. 7).

Figure 19:
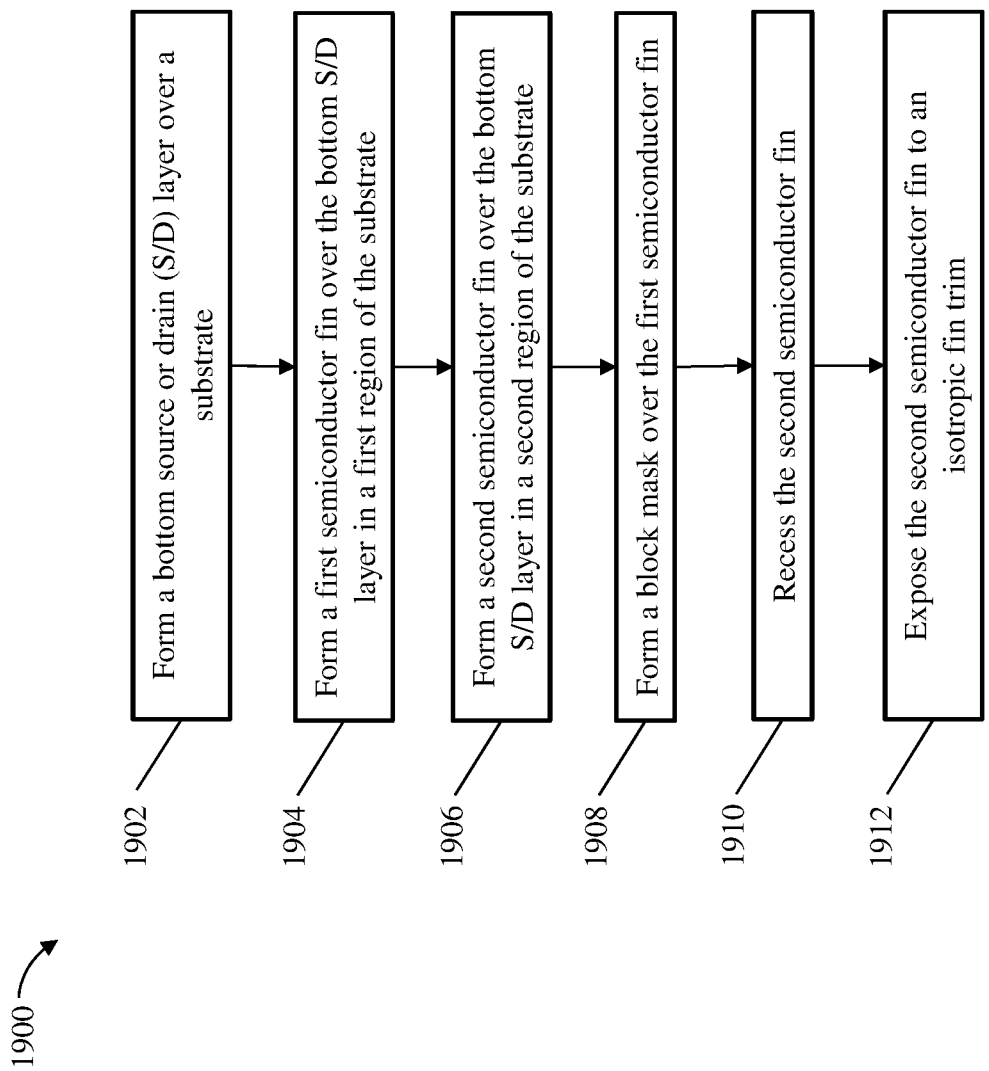
FIG. 19 depicts a flow diagram illustrating a method according to one or more embodiments of the invention.

FIG. 19 depicts a flow diagram 1900 illustrating a method for forming a semiconductor device according to one or more embodiments of the invention. As shown at block 1902, a bottom source or drain (S/D) layer is formed over a substrate. At 1904, a first semiconductor fin is formed over the bottom S/D layer in a first region of the substrate. The first semiconductor fin can be formed in an EG region of the substrate in a similar manner as the semiconductor fin 106 depicted in FIG. 11 or the semiconductor fin 1602 depicted in FIG. 16, as previously described herein.

As shown at block 1906, a second semiconductor fin is formed over the bottom S/D layer in a second region of the substrate. The second semiconductor fin can be formed in an SG region of the substrate in a similar manner as the SG fins 602 depicted in FIG. 11 or the SG fins 1604 depicted in FIG. 19, as previously described herein.

At block 1908, a block mask is formed over the first semiconductor fin. In this manner, the second semiconductor fin in the second region of the substrate can be exposed.

At block 1910, the second semiconductor fin is recessed. The second semiconductor fin can be recessed using an etch back as depicted in FIG. 5 or using a semiconductor layer recess as depicted in FIG. 15.

At block 2012, the second semiconductor fin is exposed to an isotropic fin trim. The second semiconductor fin can be exposed to an isotropic fin trim as depicted in FIG. 6 or as depicted in FIG. 18.

Figure 20:
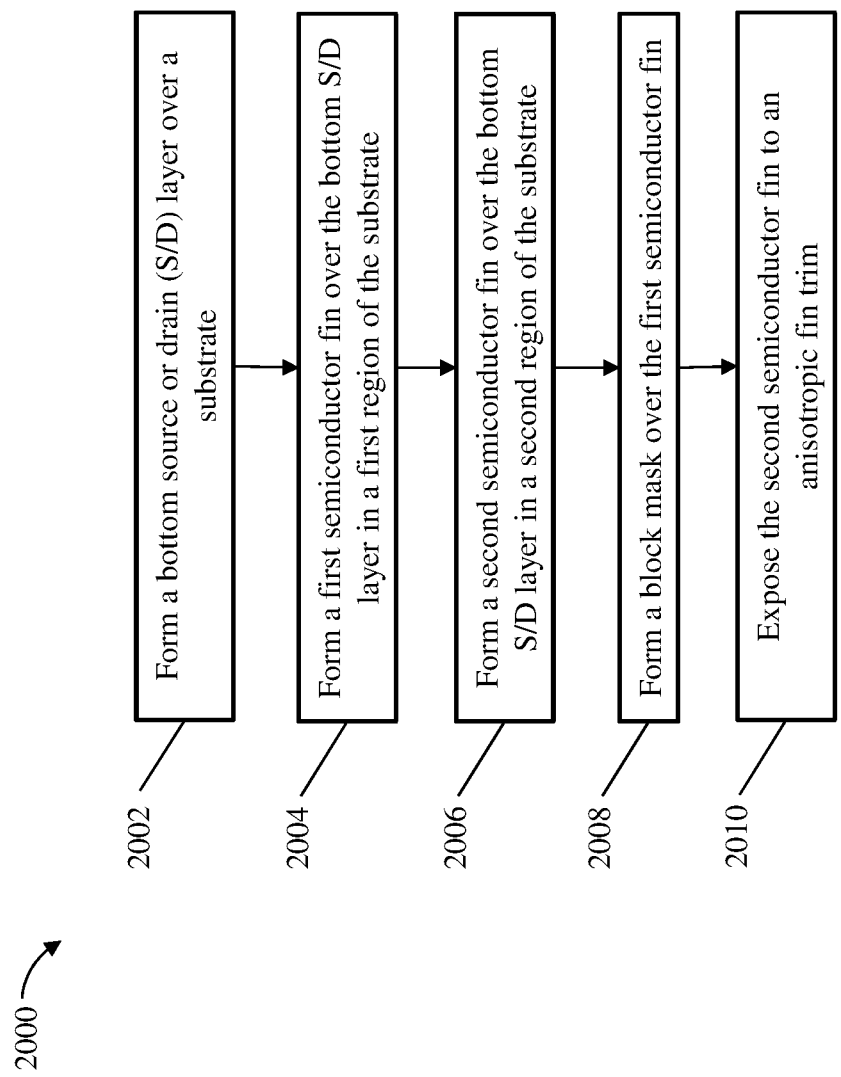
FIG. 20 depicts a flow diagram illustrating a method according to one or more embodiments of the invention.

FIG. 20 depicts a flow diagram 2000 illustrating a method for forming a semiconductor device according to one or more embodiments of the invention. As shown at block 2002, a bottom S/D layer is formed over a substrate. At 2004, a first semiconductor fin is formed over the bottom S/D layer in a first region of the substrate. The first semiconductor fin can be formed in an EG region of the substrate in a similar manner as the semiconductor fin 106 depicted in FIG. 12, as previously described herein.

As shown at block 2006, a second semiconductor fin is formed over the bottom S/D layer in a second region of the substrate. The second semiconductor fin can be formed in an SG region of the substrate in a similar manner as the SG fins 1302 depicted in FIG. 13, as previously described herein.

At block 2008, a block mask is formed over the first semiconductor fin. In this manner, the second semiconductor fin in the second region of the substrate can be exposed.

At block 2010, the second semiconductor fin is exposed to an anisotropic fin trim. The second semiconductor fin can be exposed to an anisotropic fin trim as depicted in FIG. 6 or as depicted in FIG. 13.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a bottom source or drain (S/D) layer over a substrate;
    forming a first semiconductor fin over the bottom S/D layer in a first region of the substrate;
    forming a second semiconductor fin over the bottom S/D layer in a second region of the substrate;
    forming a block mask over the first semiconductor fin;
    recessing the second semiconductor fin; and
    exposing the second semiconductor fin to an isotropic fin trim comprising a reactive surface etch that decreases a fin width of the second semiconductor fin and a fin height of the second semiconductor fin by a same amount.

2. The method of claim 1, wherein the first semiconductor fin comprises a first fin height and a first fin width and the second semiconductor fin comprises a second fin height and a second fin width, and wherein the first fin height is greater than the second fin height and the first fin width is greater than the second fin width.

3. The method of claim 1 further comprising forming a shallow trench isolation region between the first region and the second region of the substrate.

4. The method of claim 1 further comprising forming a bottom spacer over the bottom S/D layer and adjacent to sidewalls of the first semiconductor fin and sidewalls of the second semiconductor fin.

5. The method of claim 4 further comprising forming a gate over the bottom S/D layer and adjacent to sidewalls of the first semiconductor fin and sidewalls of the second semiconductor fin.

6. The method of claim 5 further comprising recessing the gate to define a first channel region of the first semiconductor fin and a second channel region of the second semiconductor fin.

7. The method of claim 6, wherein the first channel region comprises a first gate length and the second channel region comprises a second gate length, and wherein the first gate length is larger than the second gate length.

8. The method of claim 6 further comprising forming a top spacer over a surface of the gate and adjacent to sidewalls of the first semiconductor fin and sidewalls of the second semiconductor fin.

9. The method of claim 8 further comprising:
    forming a first top S/D layer over a top surface of the first semiconductor fin; and
    forming a second top S/D layer over a top surface of the second semiconductor fin.

10. The method of claim 9 further comprising:
    forming a first contact over the first top S/D layer; and
    forming a second contact over the second top S/D layer.

11. A method for forming a semiconductor device, the method comprising:
    forming a bottom source or drain (S/D) layer over a substrate;
    forming a first semiconductor fin over the bottom S/D layer in a first region of the substrate, the first semiconductor fin comprising a first fin height and a first fin width;
    forming a second semiconductor fin over the bottom S/D layer in a second region of the substrate, the second semiconductor fin comprising a second fin height and a second fin width, wherein the first fin height is greater than the second fin height and the first fin width is greater than the second fin width;
    forming a block mask over the first semiconductor fin; and
    exposing the second semiconductor fin to an anisotropic fin trim.

12. The method of claim 11, wherein the anisotropic fin trim decreases a fin width and a fin height of the second semiconductor fin by a different amount.

13. The method of claim 12, wherein the anisotropic fin trim comprises a fin height to fin width selectivity of more than 5 to 1.

* * * * *